United States Patent [19]

Gray

[11] Patent Number: 5,027,108
[45] Date of Patent: Jun. 25, 1991

[54] BURIED POWER LINE CONTACT ALERT

[76] Inventor: Alden J. Gray, P.O. Box 51, Ashfield, Mass. 01330

[21] Appl. No.: 487,830

[22] Filed: Mar. 5, 1990

[51] Int. Cl.[5] ............................................. G08B 21/00
[52] U.S. Cl. .................................. 340/662; 340/650; 361/91; 324/67
[58] Field of Search .................... 340/649–650, 340/660, 661, 662; 324/67; 361/91

[56] References Cited

U.S. PATENT DOCUMENTS

| | | | |
|---|---|---|---|
| 3,916,298 | 10/1975 | Ulrich | 324/67 X |
| 4,398,188 | 8/1983 | Feigal et al. | 340/650 |
| 4,697,137 | 9/1987 | Haddon et al. | 324/512 |
| 4,755,805 | 7/1988 | Chau | 340/662 |

Primary Examiner—Joseph A. Orsino
Assistant Examiner—Jeffery A. Hofsass

[57] ABSTRACT

A method and a device for use with horizontal boring equipment or excavating equipment while making an underground tunnel or digging near known or unknown electric power lines. The device indicates contact with the electrical conductors, whether the contact is momentary or continuous, by monitoring voltage gradients in the earth and activating an alarm if voltage is sensed.

5 Claims, 2 Drawing Sheets

BURIED POWER LINE CONTACT ALERT

BACKGROUND

1. Field of Invention

This invention relates to safety devices for horizontal boring or excavating operations, specifically to an alerting or warning method and device that indicates that an electrical power source has been contacted and its insulation broken.

All equipment used to excavate ground cavities have a potential hazard of damaging buried electrical cables, and as more cables are buried the probability increases. The process of horizontal boring is particularly hazardous because it is usually employed to make a tunnel or conduit for installation of lines under an existing structure, road, or private lawn where power lines are common.

2. Discussion of Prior Art

It has been an erroneous general feeling and teaching that a metal rod buried in earth will be grounded and will cause circuit protection devices to open if the rod contacts a power transmission line. OSHA, UL, and NEC codes and standards have indicated an acceptable ground rod will have an impedance of 25 ohms or less. At 25 ohms, a 115 volt house line will only draw less than 5 amps. Field measurements on horizontal bore strings buried over 25 feet in length show impedances back to utility power returns of up to several hundred ohms. Vertical rods usually have lower impedances.

Earth has a very high impedance to the flow of electricity compared to the low impedance of most metals. Any metal that contacts an electric transmission line even if on top of or buried in earth will attain the voltage level of that line.

If the earth impedance is high, only small currents will flow and the hazard potential will be great. Fuses and circuit protection may not turn the power off. Also large voltage gradients through the earth may present hazards to bystanders and workers standing on the ground some distance from the equipment.

If the earth impedance is low, large currents will flow and fuses, breakers, or switch gear will trip. On-site workers may not feel or see any sign of the contact, or conversely it is possible the jolt will be lethal. If switchgear was tripped, it may automatically reclose after a few seconds.

With either high or low impedance earth, there will be a voltage difference or gradient between the line-contacting metal and nearby earth irrespective of any attempts to 'ground' the equipment. There will also be voltage gradients through the earth as a function of the space or distance from the equipment to line contact point. Therefore, sensing the gradient from the equipment to earth or from close earth to farther earth serves the same purpose and provides a reliable indication of contact or breeched insulation.

The current sensing alarm in U.S. Pat. No. 4,755,805 to Chau, 1988 Jul. 5, requires an equipment grounding point sufficient to reduce voltages at the equipment to a negligible level. Since switchgear typical in shopping malls are designed to open lines drawing 80,000 amps, an adequate ground point and wire would have to have much less than 1 milliohm for a negligible voltage at the equipment. A sensing coil used to detect the current would in itself defeat the ability to obtain a low resistance ground.

Frequently, when boring or excavating, a power line will be hit a momentary glancing blow removing insulation but not causing major burns or other indication of contact. Also, a line may be protected with fuses or switchgear that trip quickly. In either case, Chau's horn, of the above referenced patent, would not sound. A subsequent movement, return of the bit, or closing switchgear might cause a hazard. In the device of the present invention, the horn is latched in its activated state with even a momentary voltage and must be manually reset after all hazards are known to be cleared.

Therefore, it is an objective of this invention to provide a method and a device for announcing contact of a boring bit or excavation tool with an in-ground source of electricity such as a buried power line.

An additional objective is to provide a continuing signal if the contact with an electrical source is only momentary.

Another objective of this invention is to provide a signaling device that does not require on-site measurement, calibration or provision of a special equipment ground.

A further objective of this invention is to provide a conveniently small and portable device that can be mounted on excavating or boring equipment or that can be carried separately as an independant device that may be used with portable tools such as digging bars, shovels or any other earth penetrating equipment.

Other objects and advantages of this invention will be apparent after consideration of the drawings and descriptions.

SUMMARY OF THE INVENTION

As will be more completely described, the invention disclosed herein is of a method and a device that senses voltage gradients within the earth near boring or excavating equipment and sounds an alert signal when the earth voltage gradients exceed a predetermined level. Voltage is sensed because any current flowing through the earth will cause voltage gradients for sufficiently large distances from the source, an no other requirements need be placed on the boring or excavating equipment being used. sound off. In actual practice, either one or both methods of mounting the invention may be used at an excavation site.

FIG. 2 shows an equivalent combined schematic and block diagram of the system of FIG. 1. An electrical power source 40 such as a generator or substation transformer has an equivalent nominal output impedance $Z_t$ and is connected to earth ground through some non-zero impedance $Z_g$. A fuse 44, or any other protection device, connects the power source 40 to the buried power line 30 which has a distributed characteristic impedance $Z_L$. If a drill bit 26 contacts the power line 30 at contact point 46 current will flow through the variable contact resistance $R_v$, the distributed resistance $R_i$ of the iron drill tube 18, the drill tube joint resistances $R_j$, and multiple, interchangeable earth path resistances $R_s$. It is obvious now that this current path from the contact point 46 through the drill bit 26 and the bore tube 18 is representative of any current path through any metal member of any type of excavating equipment forced into the earth contacting a power line.

Any representative earth path resistance $R_{s1}$ is broken into three series resistances $R_a$, $R_b$, and $R_c$. The resistance from the equipment to the electronics box 14 may be negligible if the box is mounted on the equipment or a finite value if used independently. The earth resistance $R_b$ is between the box contact point 60 and the The output voltage of amplifier A2 is fed to the positive input of operational amplifier A3 which is connected with positive feedback to act as a comparator. When ever the positive input voltage V1 exceeds the reference negative input voltage V2, the output of A3 will be its positive rail voltage. Input resistor R11 is selected high enough in relation to feedback resistor R12 so that if the output of A3 is high the positive input voltage V1 will be higher that the reference negative input voltage regardless of the output voltage of amplifier A2, thereby creating a latch condition. (If the reference input voltage is selected higher than the feedback voltage, the circuit will not latch and the system may be useful on construction equipment, that may potentially contact overhead power lines, to warn operators of a contact and allow them to move away from the wire before disembarking or otherwise jeopardizing their safety.) The entire unit is powered by a battery 56 which when disconnected by the reset switch 58 allows amplifier A3 to return to its initial relaxed condition, and when power is restored, the reference voltage V2 will come up faster than the feedback voltage V1 allowing the condition of amplifier A2 to control.

The output of amplifier A3 drives a conventional MOSFET switch circuit 52 which when activated completes a return circuit for a conventional loud horn 54.

DESCRIPTION OF THE PREFERRED EMBODIMENTS

Figure 1:
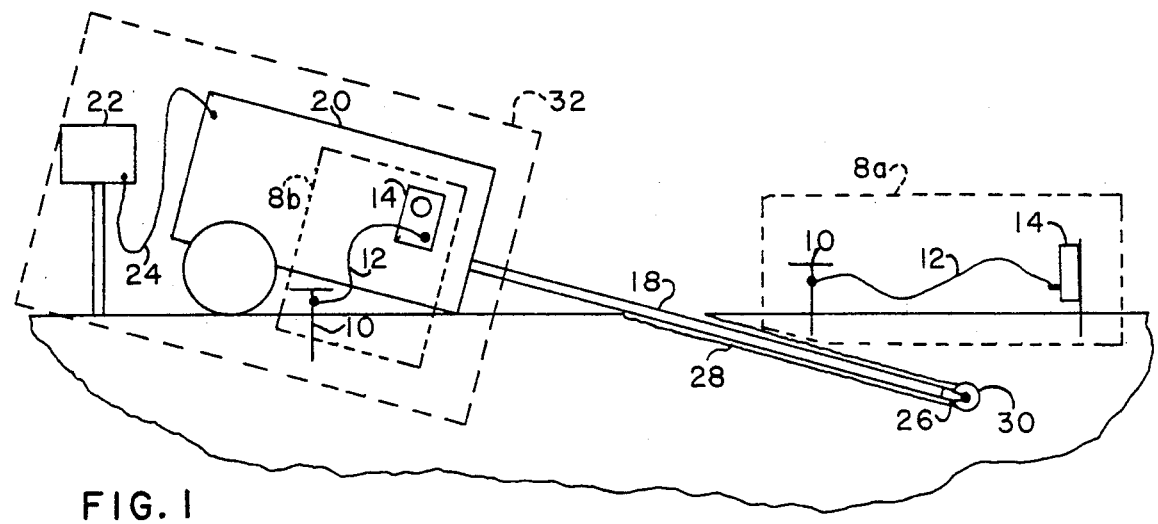
FIG. 1 is a diagrammatic illustration of a boring machine employing the invention.
Figure 2:
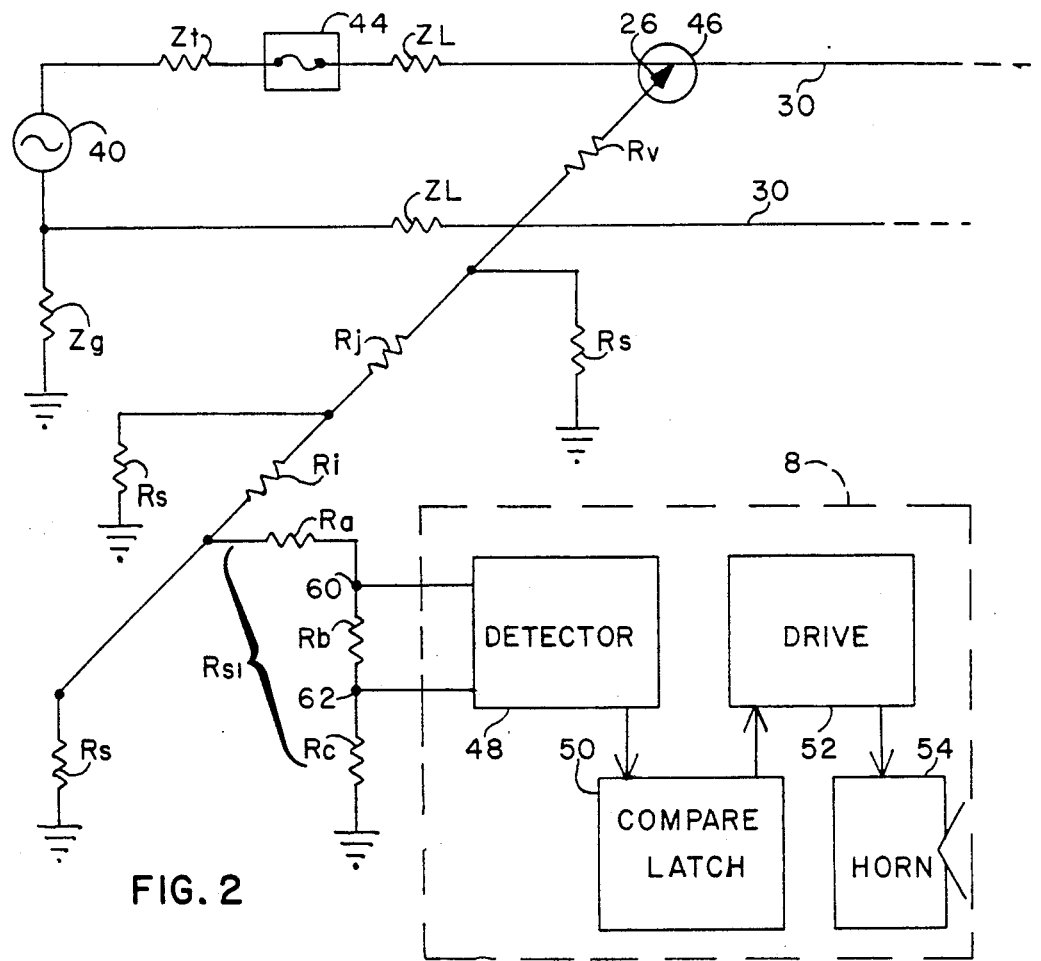
FIG. 2 shows a representative schematic of a power transmission line in contact with a boring string and a block diagram of the device of the invention.

As FIG. 1 depicts, the signaling device of this invention 8 comprising a ground spike 10, a connecting wire 12 and an electronics box 14 may be used with a horizontal boring machine 32 or any other machine or tool that bores or excavates the earth. In this example, the horizontal boring machine 32 is comprised of a power driven carriage 20 which rotates and pushes a bore tube 18 to which is attached a boring bit 26 to make a tunnel 28. An operator controls the boring operation from a remote control stand 22 with attached control leads 24 to keep him away from any potentially electrified equipment. If the boring bit 26 contacts and damages a hidden buried power line 30, voltage gradients in the earth will cause the signaling device 8a to sound off, and the voltage gradient from the horizontal boring machine 32 to earth at some distance will cause the signaling device 8b to ground spike contact point 62, and the leftover earth resistance $R_c$ will be a reasonable finite value. It can be seen that for any non-zero soil resistance and non-zero line voltage there will be a voltage across $R_b$ if the contact resistance $R_v$ is finite.

The circuit in the electronics box 14 includes a voltage detection function 48, a comparator/latch circuit 50 to compare the detected voltage level to a set reference level and latch the result that turns on the driver 52 and activates the horn 54 or any other warning device. The entire unit is powered by a battery 56 which when disconnected by the reset switch 58 allows the latch 50 to return to its initial relaxed condition.

Figure 3:
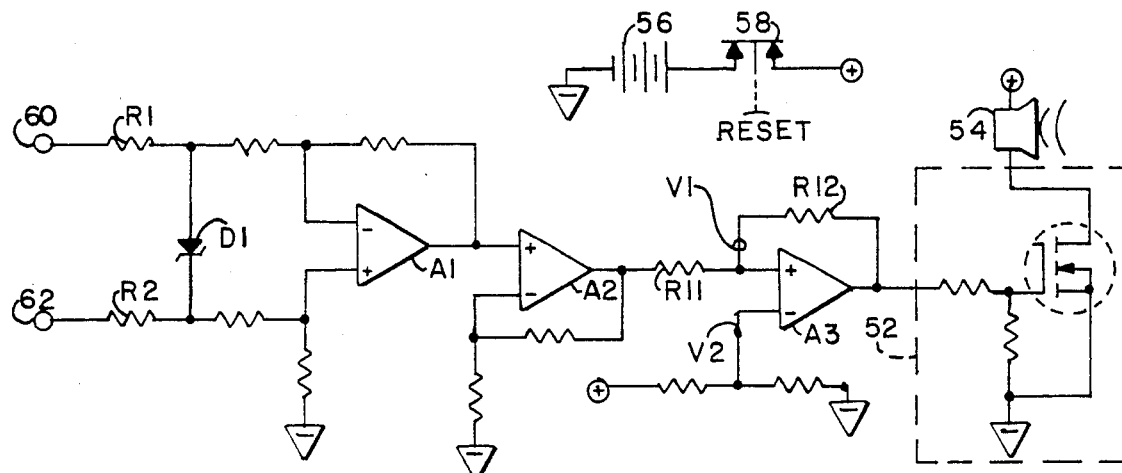
FIG. 3 is a schematic of the electronics used in a working model of the device of this invention.
Figure 4:
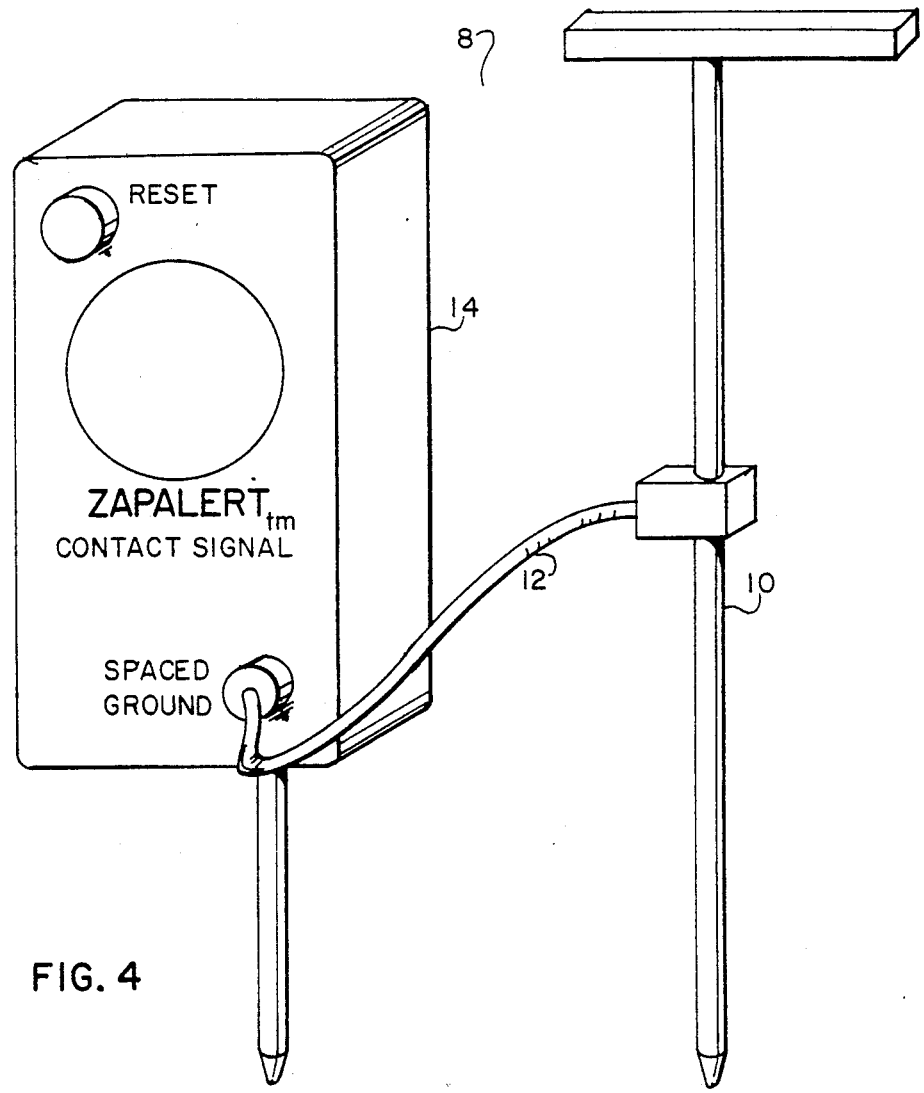
FIG. 4 is a pictorial of the device of this invention as presently packaged as a portable instrument.

The schematic in FIG. 3 shows operational amplifier A1 connected with resistances to act as a differential amplifier sensing the voltage difference between the box contact point 60 and the ground spike contact point 62. The output of operational amplifier A1 is amplified and isolated by operation amplifier A2. The inputs to A1 are protected from over voltages by zener diode D1. The resistors R1 and R2 in combination with diode D1 are selected to burn open before any other part of the circuit is damaged if the sensed voltage is extremely high for a relatively long period of time. (Voltages as high as 120,000 volts are known to be buried with plans for much higher voltages being made.)

Note that input noise protection to avoid false firing is not needed because voltage gradient noise in the earth is extremely low except in extraordinary circumstances such as thunderstorms.

OPERATION

A worker or crew about to dig or bore a hole would first follow all normal safety procedures of calling utilities to mark line locations and of wearing protective apparel, etc. Then the device of this invention would be placed near the hole, with the box and the spike separated by a few feet. Boring or digging would then begin. If an unknown or incorrectly located power line is damaged, the horn will sound and workers can leave the location until experienced electrical crews remove the hazard. Without the alarm, unaware workers may move to hazardous locations or attempt to bare hand the now possibly energized equipment. Also, if the workers do not know a line has been damaged, they might leave the damaged wire and cause a future power failure or more serious accident.

I claim:

1. A method that produces a warning signal when either grounded and ungrounded conductive excavating equipment causes damage to an underground power cable and at least momentarily shorts to earth including:
    locating an excavation site and before excavation begins, placing means for directly, electrically contacting the earth in close enough proximity to said excavating equipment to monitor the condition of any power cables in the path of said excavating equipment,
    placing said means for directly, electrically contacting the earth at two isolated spaced points in the vicinity of, but not contacting said excavating equipment,
    sensing a voltage difference between said two spaced points, said voltage difference being produced by a power signal normally carried on said power cable, and
    immediately activating an alarm when said voltage difference exceeds a preset value.

2. The method of claim 1 including:
    latching said alarm in its activated state any time said voltage difference exceeds said preset value.

3. The method of claim 2 including:
    protecting the alarm even if detecting circuits are burned by excessive voltages.

4. A method of warning that ground connected excavating equipment is or has been electrically energized including instantly sensing the earth voltage gradient between said ground connected excavating equipment and earth a finite distance away, determining that said earth voltage gradient is greater than a preset value, immediately activating an alarm when said earth voltage gradient greater than said preset value is sensed, and latching or holding said alarm activated after any actuation, wherein said alarm may be reset, and;

allowing the alarm to stay active even if excessive voltage is present by having a particular circuit component burn open before the alarm is damaged.

5. A device for warning that ground connected excavating equipment is or has been electrically energized including:

means for instantly sensing the earth voltage gradient between said ground connected excavating equipment and earth a finite distance away, means for determining that said earth voltage gradient is greater than a preset value, means for immediately activating an alarm when said earth voltage gradient greater than said preset value is sensed, means for latching or holding said alarm activated after any actuation, means for resetting the alarm after the alarm has been activated, and means for allowing the alarm to stay active even if excessive voltage is present by having a particular circuit component burn open before the alarm is damaged.

* * * * *